Figure 1:
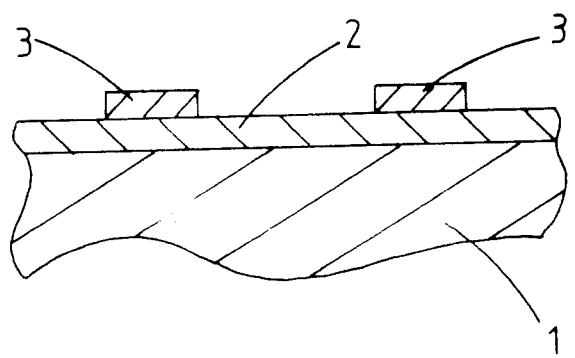

United States Patent [19]

Meyer et al.

[11] Patent Number: 4,504,574
[45] Date of Patent: Mar. 12, 1985

[54] METHOD OF FORMING A RESIST MASK RESISTANT TO PLASMA ETCHING

[75] Inventors: Joseph Meyer, Redhill; David J. Vinton, Burgess Hill, both of England

[73] Assignee: U.S. Philips Corporation, New York, N.Y.

[21] Appl. No.: 496,702

[22] Filed: May 20, 1983

[30] Foreign Application Priority Data

May 26, 1982 [GB] United Kingdom ............... 8215432

[51] Int. Cl.³ .............................................. G03C 5/38
[52] U.S. Cl. ...................................... 430/331; 430/313; 430/323; 156/628; 156/643; 156/659.1; 427/38
[58] Field of Search ............... 430/312, 313, 314, 315, 430/323, 325, 326, 330, 296, 331, 317; 156/643, 628, 659.1; 427/38, 43.1

[56] References Cited

U.S. PATENT DOCUMENTS 4,253,888 3/1981 Kikuchi ........................... 148/187
4,370,405 1/1983 O'Toole et al. .................. 430/312
4,373,018 2/1983 Reichmanis et al. ............. 430/312

OTHER PUBLICATIONS

Johnson et al., IBM Technical Disclosure Bulletin, vol. 20, No. 9, Feb. 1978, pp. 3737-3738.

Primary Examiner—John E. Kittle
Assistant Examiner—José G. Dees
Attorney, Agent, or Firm—Paul R. Miller

[57] ABSTRACT

A mask which is resistant to a plasma etching treatment is formed by lithographically patterning a radiation sensitive film present on a substrate. The etch resistance of the mask is enhanced by exposure to a carbon monoxide plasma which forms a region with an enhanced etch resistance over the surface of the patterned film. This method may be used, for example, to manufacture a photomask using a chromium coated glass substrate, or during the manufacture of semiconductor devices on a semiconductor wafer substrate.

9 Claims, 2 Drawing Figures

U.S. Patent     Mar. 12, 1985     4,504,574

METHOD OF FORMING A RESIST MASK RESISTANT TO PLASMA ETCHING

This invention relates to a method of forming on a substrate a mask resistant to plasma etching with the mask comprising a lithographically patterned film of radiation sensitive resist.

The technique of plasma etching is well known and commonly used in the manufacture of semiconductor devices. In this context reference is invited, for example, to the article entitled "Plasma Etching in IC technology" by Kalter and van de Ven, which appeared at pages 200 to 210 of Philips Technical Review, Vol. 38, 1978/79, No. 7/8. It is noted that the term plasma etching is used in the present specification in its broad sense to include so-called reactive ion etching.

Radiation sensitive resists commonly used in the semiconductor industry are sensitive to different forms of radiation. For example, some resists are sensitive to visible light and some to X-rays, while others are sensitive to radiation in the form of beams of charged particles such as electrons. By using the so-called lithographic technique involving exposure to appropriate radiation followed by developing in a suitable solvent, a film of resist present on a substrate can be patterned to form a mask which is resistant to a subsequent plasma etching treatment.

Radiation sensitive resists are classified as positive or negative acting. When a positive acting resist is exposed to radiation, the exposed parts can be removed selectively because they become soluble in a developing solution with the unexposed parts remaining insoluble. In the case of a negative acting resist, the exposed parts become insoluble while the unexposed parts remain soluble. In general positive acting resists allow better resolution than their negative acting counterparts. Thus because of their compatibility with miniaturization the semiconductor industry has tended to prefer positive acting resists for the manufacture of integrated circuits despite the fact that their resistance to plasma etching is generally inferior to negative acting resists. To counteract the problem of poor etch resistance it is usual to use a relatively thick layer (typically in the range 0.5 to 1 micrometer) of resist in order to compensate for undesirable erosion but, unfortunately, resolution is reduced as the resist thickness increases.

Attempting to improve the resistance of positive resists to plasma etching while retaining the benefit of high resolution, other workers in the art have devised different plasma etch systems and new positive resist materials. For example in his paper "Additives that Improve Positive Resist Durability for Plasma Etching", J. Electrochemical Society: Solid-State Science and Technology, Vol. 127, No. 2, February 1980, pages 491 to 497, Katsuhiro Harada claims that the etch resistance of conventional positive resists can be improved by including an additive such as a radical scavenger or a free radical, e.g. 1,1-diphenyl-2-picrylhydrazyl and galvinoxyl, or a plastics antioxidant, e.g. 2,4,6-tritertbutylphenol. Unfortunately, however, it seems that with Harada's technique increased etch resistance is often obtained at the expense of other important properties such as the sensitivity of the resist.

According to the present invention a method of forming on a substrate a mask resistant to plasma etching with the mask comprising a lithographically patterned film of radiation sensitive resist is characterized by the step of exposing the patterned film to a carbon monoxide plasma to form at the surface of the patterned film a region having an enhanced resistance to plasma etching.

The Applicants were surprised to find that exposure of the resist to a carbon monoxide plasma acted to enhance the resistance of the resist mask to a subsequent etching treatment. This result was especially surprising in view of the fact that the etch resistance was unaffected or, in some cases, impaired by exposing the patterned resist to other plasmas.

The enhanced etch resistance of the surface region formed in this method significantly reduces the plasma etch rate of the resist-based mask so that thinner resist films, for example thinner than 0.4 micrometer, can be used for increased resolution.

In contrast with the prior art techniques mentioned above, the method of the present invention does not require new materials or new etching systems. On the contrary, it merely employs materials and processing steps which, in their own right, are well-known in the semiconductor industry.

The advantage of a reduced plasma etch rate is particularly important when the resist is positive acting, but the method of the invention may also be used with negative acting resists.

Figure 2:
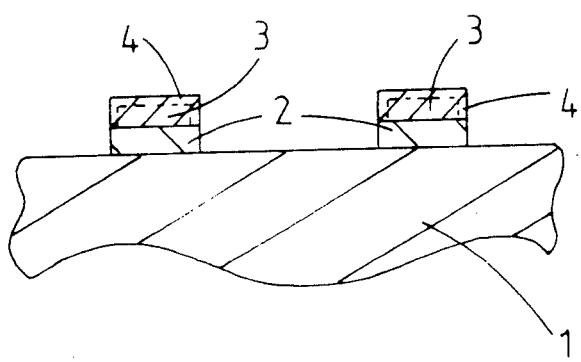

An embodiment of the invention will now be described by way of example with reference to the accompanying drawing in which:

FIGS. 1 and 2 are cross-sectional views showing subsequent stages in the formation of a plasma etch resistant mask on a substrate using a method in accordance with the invention.

It is noted that, for the sake of clarity, the Figures are not drawn to scale.

The following description relates to the manufacture of a photomask suitable for use in conventional photolithographic techniques employed in semiconductor wafer processing.

A layer 2 of chromium, typically 0.1 micrometer thick, is deposited, for example using conventional sputtering techniques, onto an alumino-silicate or synthetic quartz substrate 1. A film of a cross-linked positive acting resist as described in United Kingdom Patent Specifications GB 1,445,345 and GB 1,500,541 is then provided on the chromium layer 2. The resist which may, for example, comprise a mixture of poly-(methyl methacrylate-co-methacrylic acid) and poly-(methyl methacrylate-co-methacryloyl chloride) is sensitive to electron radiation so that the resist film can be patterned using electron beam lithography techniques well-known to those skilled in the art. Thus, after exposure to an electron beam, the resist film is developed to leave the patterned resist film 3.

Next, the resist film 3 is exposed to a carbon monoxide plasma at 0.4 Torr, 100 W for 5 minutes, in a conventional plasma etching apparatus. Surprisingly this treatment forms at the surface of the patterned resist film 3 a region 4 having an enhanced resistance to a subsequent plasma etching step. As mentioned above, this result is particularly surprising in view of the fact that a similar treatment carried out by the Applicants with other plasmas has not enhanced the etch resistance of the mask and in some cases the etch resistance has even been impaired by such a treatment.

The next step involves patterning the chromium layer 2 by plasma etching. At this step the patterned resist film 3 with the surface region 4 acts to mask the underlying parts of the chromium layer 2. It has been found in practice that the resistance of the plasma etch resistant region 4 can increase the etch resistance of the mask by a factor of two. The chromium may be etched in a plasma containing 1 part carbontetrachloride to 1 part oxygen in 3 parts of a carrier gas such as argon or carbon monoxide at 0.5 Torr., 400 watts for 10 minutes.

The patterned resist film 3 together with region 4 are then removed using fuming nitric acid to leave the photomask comprising the patterned opaque chromium layer 2 on the glass substrate 1.

A similar method to that described above may also be used to manufacture a photocathode mask for use in the known technique of electron beam image projection. In this case the substrate 1 would be made of quartz, and the surface layer 2 would again comprise chromium. However the patterned chromium layer and the exposed surface parts of the substrate would be coated with a photocathode material, such as caesium iodide, which can act as an electron source when the mask is flooded from behind with ultraviolet radiation.

A method in accordance with the invention may also be used directly to process a semiconductor wafer. In this case the substrate 1 would itself be the semiconductor wafer and the surface layer 2 would be a layer of material, for example an oxide, which is capable of masking the semiconductor surface against a subsequent processing step.

In the light of the description given here it will be clear to the person skilled in the art that many modifications are possible within the scope of this invention.

What is claimed is:

1. A method of forming a mask resistant to plasma etching comprising the steps of
    forming a lithographically patterned layer of radiation sensitive resist on a substrate, and
    exposing said patterned resist to a carbon monoxide plasma to form on the surface of said patterned resist a region having enhanced resistance to plasma etching.

2. A method according to claim 1, wherein said radiation sensitive resist is positive acting.

3. A method according to claim 1, wherein said radiation sensitive resist is a cross-linked positive acting copolymer resist.

4. A method according to claim 3, wherein said copolymer resist includes a mixture of poly-(methyl methacrylate-co-methacrylic acid) and poly-(methyl methacrylate-co-methacryloyl chloride).

5. A method according to claim 1, wherein said resist has a thickness of less than 0.4 micrometers.

6. A method according to claim 1, wherein said patterned resist is formed on a chromium layer on the surface of said substrate.

7. A method according to claim 6, wherein said substrate is an alumino-silicate substrate or a synthetic quartz substrate.

8. A method according to claim 1, wherein said carbon monoxide plasma is formed at a pressure of 0.4 Torr, and a power of 100 W for 5 minutes.

9. A method according to claim 1, wherein said substrate is a semiconductor material.

* * * * *